United States Patent [19]

Robinson et al.

[11] Patent Number: 4,829,235
[45] Date of Patent: May 9, 1989

[54] FOUR-TERMINAL CONNECTOR FOR MEASURING RESISTANCE OF A PYROTECHNIC INITIATOR

[75] Inventors: Robert L. Robinson, Pearland; Thomas J. Graves, Houston; William C. Hoffman, III, Friendswood, all of Tex.

[73] Assignee: The United States of America as represented by the Administrator of the National Aeronautics and Space Administration, Washington, D.C.

[21] Appl. No.: 32,685

[22] Filed: Apr. 1, 1987

[51] Int. Cl.[4] .................. G01R 27/08; G01R 31/00
[52] U.S. Cl. ..................................... 324/64; 324/502; 324/65 P
[58] Field of Search ............... 324/502, 503, 504, 537, 324/550, 64, 65 P, 72.5, 149, 407, 408; 340/638; 439/668, 669; 102/202.9, 202.14, 202.7

[56] References Cited

U.S. PATENT DOCUMENTS

| | | | |
|---|---|---|---|
| 2,485,881 | 10/1949 | Helin | 324/72.5 X |
| 2,543,754 | 3/1951 | Beach | 324/502 |
| 3,045,080 | 7/1962 | Frantz et al. | 200/51.02 |
| 3,108,843 | 10/1963 | Frantz | 339/130 |
| 3,200,355 | 8/1965 | Dahlen | 333/79 |
| 3,278,885 | 10/1966 | Klinger | 339/60 |
| 3,689,830 | 9/1972 | Caldwell et al. | 324/502 |
| 3,772,545 | 11/1973 | Hatschek et al. | 310/71.310 |

OTHER PUBLICATIONS

"Increased Accuracy of Squib Bridgewire Measurements Using a 4-Contact 2-Pin Connector", Hoffman, III, William C., pp. 307–311. Eleventh International Pyrotechnics Seminar, Vale, Colo., Jul. 7, 1986.

*Primary Examiner*—Reinhard J. Eisenzopf
*Assistant Examiner*—Jack B. Harvey
*Attorney, Agent, or Firm*—Russell E. Schlorff; John R. Manning; Edward K. Fein

[57] ABSTRACT

A four-terminal electrical connector device (40) for testing and measuring unknown resistances of initiators (11) used for starting pyrotechnic events aboard a Space Transportation System. The testing device minimizes contact resistance degradation effects and so improves the reliability of resistance measurement taken with the device. Separate and independent voltage sensing (19) and current supply (20) circuits each includes a pair of socket contacts (13–16) for mating engagement with the pins (17,18) of the initiator. The unknown resistance that is measured by the device is the resistance of the bridgewire (23) of the initiator which is required to be between 0.95 and 1.15 ohms.

6 Claims, 3 Drawing Sheets

FOUR-TERMINAL CONNECTOR FOR MEASURING RESISTANCE OF A PYROTECHNIC INITIATOR

ORIGIN OF THE INVENTION

The invention described herein was made by employee(s) of the U.S. Government and may be manufactured and used by or for the Government of the Unitd States of America for governmental purposes without the payment of any royalties thereon or therefor.

BACKGROUND OF THE INVENTION

1. Field of the Invention

All ohmmeters, two-terminal and four-terminal, measure resistance by determining the ratio of voltage to current delivered to a device. In a two-terminal ohmmeter, the voltage and current input to an unknown resistance are through the same circuit, therefore any resistance in the current supply circuit will appear as a part of the unknown resistance because of additional voltage drop. A four-terminal ohmmeter supplies the voltage and current through separate circuits. This allows the voltage to be measured directly at the unknown resistance thus minimizing the effects of resistance in the current supply circuit. A constant current type power source is generally used for the current supply so that the magnitude of current remains constant with any changes of resistance in the circuit. The voltage measuring device has a high input resistance so that changes in resistance of the voltage measuring circuit cause only insignificant changes in the voltage reading.

This invention is a special type electrical connector device that allows the four-terminal concept to be used to measure the unknown resistance while eliminating or minimizing any contact resistance effects of the connector.

2. Background Art

Among the prior art patents which are deemed more or less pertinent to the technology involved in the instant invention is U.S. Pat. No. 3,045,080, which discloses a dual socket, four contact connector device adapted to receive a pair of dual contact pins. However, the thrust of this patent is to facilitate the manufacture of devices where two jacks, switches or combinations may be made in tandem in a single unit. In U.S. Pat. No. 3,108,843, there is also set forth a dual socket, four contact connector for receiving two dual contact pins. However, the expressed purpose of the patent is to provide a jack which is capable of accepting a cable and to provide an insulation from the surrounding panel. U.S. Pat. No. 3,200,355, sets forth plural conductors for each individual pin of a device. However, the conductors do not contact the pins but merely serve as parts of an RF filter within the connector itself. Specific provisions are made to incorporate in an economical fashion the RF filter and capacitor while maintaining functional reliability of the unit. A multiple contact female socket for a single cable is set forth in U.S. Pat. No. 3,278,885. However, it is not disclosed whether the cable is of the single conductor type or whether it contains a conductor for each contact. Hermetic sealing is the main objective of this patent. Lastly, U.S. Pat. No. 3,772,545 relates to a dual contact socket for a two contact pin. The main feature of this reference is the incorporation of a cable plug and side mounted contact surfaces in order to allow installation in hostile environments without extensive buildup. A hermetically sealed system is the prime consideration, even though there is provided surface contacts to establish electrical contact with two internal conductors.

None of the prior art nor any of the above patents disclose a connector for two pin resistive devices to provide increased accuracy of measurement by using a four wire measurement technique, nor do they teach minimizing contact resistance by measuring voltage drop across forward contacts.

SUMMARY OF THE INVENTION

The production of the NASA Standard Initiator, a squib used to start pyrotechnic events on the Space shuttle involves resistance measurement of a stainless steel bridgewire. The design specification requires the resistance to fall between 0.95 and 1.15 ohms. The resistance is not to vary more than 0.05 ohms from the initial value measured prior to installation on the spacecraft, a requirement to insure that no degradation has occurred. Bridgewire measurements prior to installation occasionally exceed the $\pm 0.05$ ohm requirement due to variations in contact resistance between the connector and pins. Flight quality units have been rejected due to an unreliable measurement made either at the manufacturer or at the installation site. The 4-contact connector of the present invention minimizes the effect of contact resistance in the bridgewire measurement thus providing accurate readings and reducing the number of rejections of flight quality hardware.

Thus the invention herein relates to a four-terminal electrical connector device for testing and measuring unknown resistances of initators used for starting pyrotechnic events aboard the Space Shuttle and which minimizes contact resistance degradation effects thereby improving the reliability of resistance measurements taken with the device. The device includes a connector shell having a pair of electrically independent and separate forward socket contacts, and a pair of electrically independent and separate rear socket contacts, each pair of socket contacts being so constructed and arranged so as to receive and mate with the pins of the initiator to be tested. Also, included in the device are separate and independent voltage sensing and current supply circuits for the socket contacts, the voltage sensing circuit including the forward pair of socket contacts, and the current supply circuit including the rear pair of said socket contacts, whereby the forward pair of said socket contacts provide contact with the pins of the initiator to pickup the resistance measuring voltage whereas the rear pair of said socket contacts provide contact with the pins of the initiator in order to supply the resistance measuring current.

Other advantages of this invention will be apparent from the description which follows in conjunction with the accompanying drawings and claims.

BRIEF DESCRIPTION OF THE DRAWINGS

FIG. 3 illustrates the initiator and the electrical connector independently of each other, whereas FIG. 5 shows the initiator and electrical connector in the measuring and testing mode.

In FIG. 6 the devices are illustrated independently of each other whereas in FIG. 8, the devices are shown in the measuring and testing mode.

FIG. 10 is taken along the line 10—10 of FIG. 9.

DETAILED DESCRIPTION OF THE PREFERRED EMBODIMENT

Figure 1:
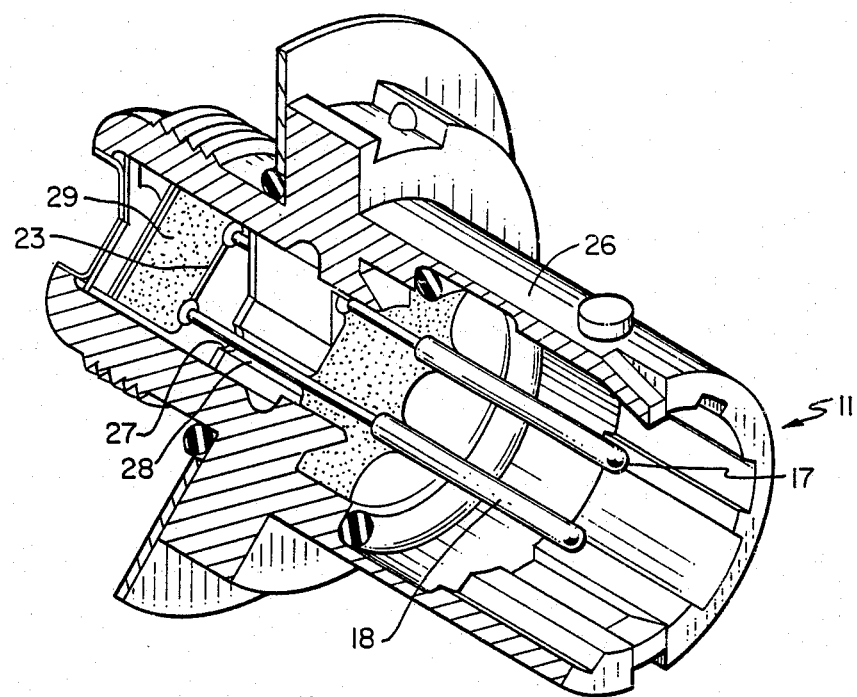
FIG. 1 is a pictorial representation partly in cross-section of an initiator device having an unknown resistance to be measured.
Figure 2:
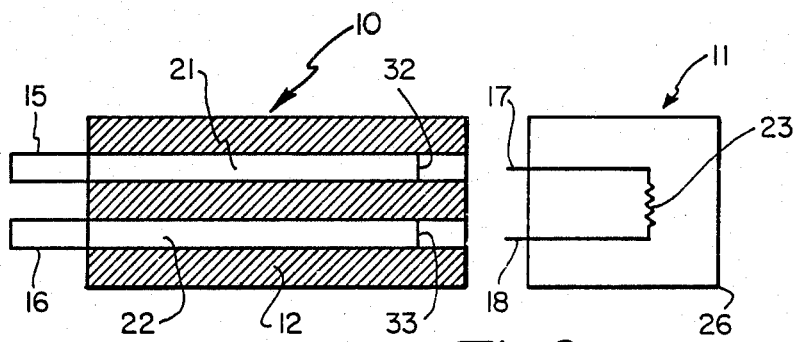
FIG. 2 is pictorial representation partly in cross-section of a two contact electrical connector device for measuring unknown resistances of an initiator device.
Figure 3:
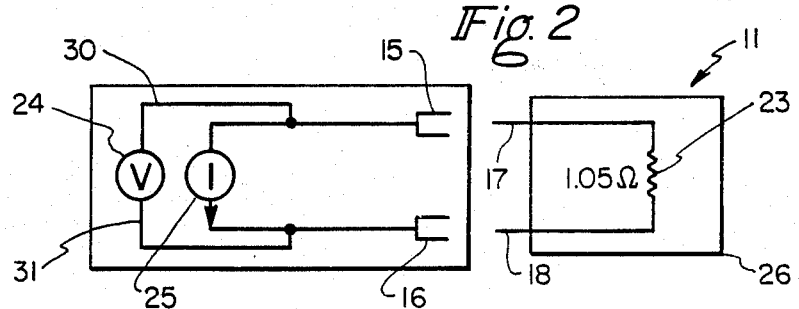
FIGS. 3 and 5 are schematic wiring diagrams of the initiator and electrical connector devices of the two contact type.

With reference to FIGS. 1 and 2, there will be seen a two contact connector 10 which has been used for measuring the bridgewire resistance of the initiator 11. FIG. 1 shows the details of the initiator 11, whereas FIG. 2 shows the connector 10 and the initiator 11 in a more simplified fashion. Bridgewire resistance is taken with an Initiator Resistance Measuring Equipment (IRME) which is a ten ma current limited unit designed specifically to make measurements on the initiator 11. The IRME is not set forth in the drawings in detail but is shown in a representative though simplified fashion in FIG. 3 for example. In FIG. 3, the connector 10 is represented by contacts 15 and 16, whereas the voltmeter 24, the power source 25 and the Leads 30 and 31, constitute what is intended to represent the IRME. In actuality, the IRME is a much more sophisticated assembly but since it does not form a part of the present invention except in order to understand the overall concept, it has not been set forth in detail. As in FIG. 3 noted above, the IRME is also so portrayed in FIGS. 5, 6, and 8. The resistance of the bridgewire is otherwise measured by the IRME with the connector 10 constituting the link between the IRME and the initiator 11.

In FIG. 1 there will be seen the electrical initiator 11 having a two mil stainless steel bridgewire 23 which carries current between two Inconel pins 17 and 18. Pins 17 and 18 are each coated with a layer of gold in order to minimize contact resistance between the electrical connector 10 in FIG. 2 and pins 17 and 18 and to increase the reliability factor. Initiator 11 will also be seen to include a housing 26 within which are located the internals of the device including a glass seal 28 and a spark gap 27. The pyrotechnic mix is shown at 29 and is typically 114 MgZrKC10$_4$.

Figure 5:
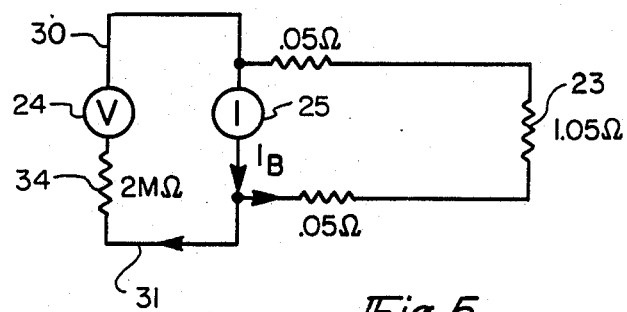

FIG. 2 shows a two contact connector 10 which has been used to make bridgewire resistance measurements on the initiator 11. Connector 10 will be seen to include a shell 12 within which are a pair of elongated bores 21 and 22. Insulators 32 and 33 are located within bores 21 and 22, and the rear socket contacts are shown at 15 and 16. Socket contacts 15 and 16 provide both the voltage sensing circuit and the input current path for the connector as will be seen in FIG. 3. As illustrated in FIGS. 3 and 5, the contact resistance between the socket contacts 15 and 16 is placed in series with the bridgewire resistance 23. The voltmeter 24 of the IRME senses the drop in voltage across the bridgewire 23 and the contact resistance. The IRME computes the bridgewire resistance by dividing the total drop in voltage across the voltmeter leads 30 and 31 by the input current from the IRME power source 25. Example I following illustrates how the measurement varies with the contact resistance.

$$I_B = \frac{(2 \times 10^6)(.01)}{2 \times 10^6 + 1.15\Omega}$$

$$I_B = 0.0100 \, A$$

$$V_B = (1.15\Omega)(0.0100 \, A)$$

$$V_B = .0115 \, V$$

IRME DERIVED RESISTANCE $$R_B = \frac{0.0115 \, V}{.01 \, A} = 1.15\Omega$$

Figure 4:
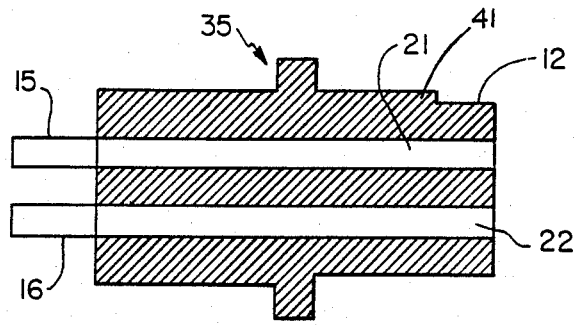
FIG. 4 is similar to FIG. 2 but showing a second construction of a two contact type connector without insulator elements therein.

It has been found that repeated mating of the two contact connector 10 with initiators 11 reduces the quality of the fit between the pins 17 and 18 and the socket contacts 15 and 16 and thereby increases the inherent contact resistance. Due to the effects of wear on the repeatability of measurements, a five hundred cycle limit has been placed on the two contact connector 10 and 35 of FIGS. 2 and 4.

Figure 6:
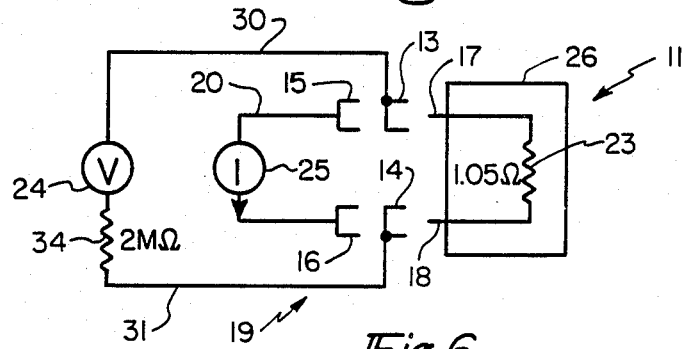
FIGS. 6 and 8 are schematic wiring diagrams of an initiator and a four contact electrical connector device.
Figure 7:
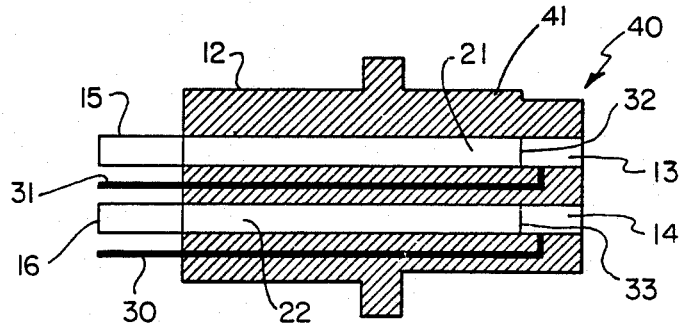
FIG. 7 is a simplified pictorial representation partly in cross-section of a four contact electrical connector device of the present invention.
Figure 8:
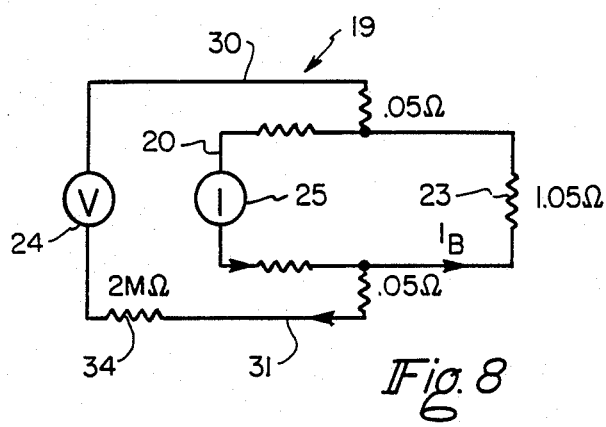

In order to reduce the number of electrical initiators being rejected because of noncompliance with the 0.05 ohm requirement it was found to be necessary to minimize the contact resistance in the measurement circuit. FIGS. 6–8 show a four contact connector 40 which achieves this objective. The voltage sensing circuit 19 and the current supply circuit 20 are split between the forward socket contacts 13 and 14 and the rear socket contacts 15 and 16, respectively. Current from power source 25 of the IRME is supplied through the rear contacts 15 and 16, and as the current flows through the contacts 15 and 16 and into pins 17 and 18 of the initiator 11, contact resistance is encountered. However, with the four contact connector design of FIGS. 6–8, the voltage sensing leads 30 and 31 of the IRME are not measuring the drop associated with rear socket contacts 15 and 16. At the point of engagement between the connector 40 and initiator 11, the current is divided between the voltage sensing circuit 19 and the bridgewire 23. Since the input impedance 34 of the voltmeter 24 is two megohms, and the bridgewire resistance is 1.05 ohms nominal, most of the current flows through the bridgewire 23. Example II following shows how the four contact connector 40 of FIGS. 6–8 improves the bridgewire measurement over the two contact connector devices 10 and 35 of FIGS. 2–5.

$$I_B = \frac{(2000001.100\Omega)(.01 \, A)}{(2000001.100\Omega + 1.05\Omega)}$$

$$I_B = .0100 \, A$$

$$V_B = (1.05\Omega)(0.01 \, A)$$

$$V_B = .0105 \, V$$

IRME DERIVED RESISTANCE $$R_B = \frac{0.0105 \, V}{.01 \, A} = 1.05\Omega$$

Figure 9:
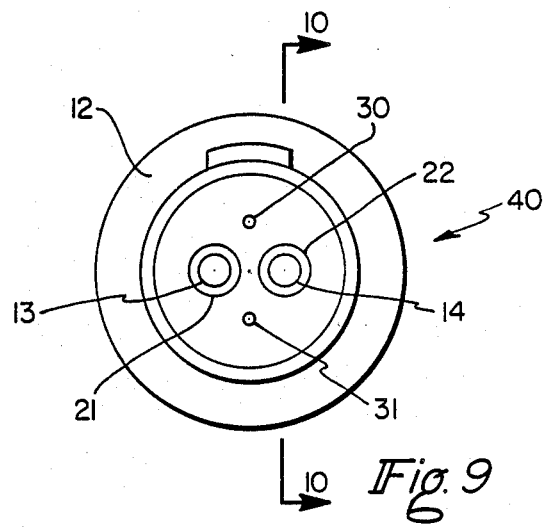
FIGS. 9 and 10 are detailed views of the four contact electrical connector device in FIG. 7 in accordance with the present invention.
Figure 10:
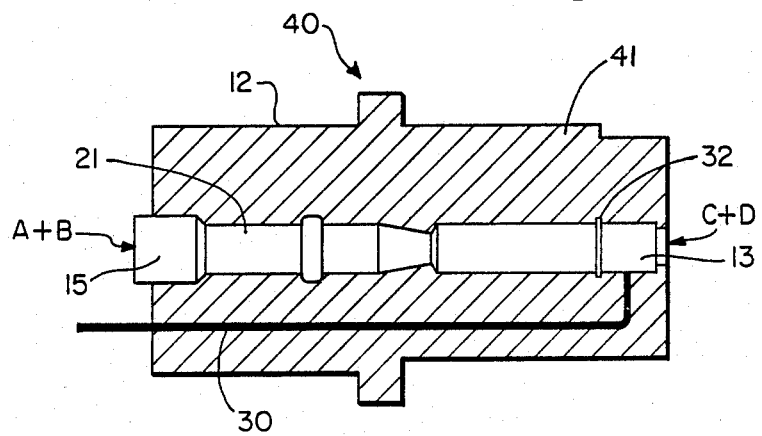

Details of the four contact connector 40 of FIG. 7 can be seen in FIGS. 9 and 10 where like numerals have been used to indicate like parts in the interest of clarity, and the previous description of FIGS. 6–8 is intended to include FIGS. 9–10 also.

Reference will now be made to the following test conducted on connectors, including the two contact type connector 10 and 35 of FIGS. 2-5 as well as the four contact type connector 40 of FIGS. 6-10. In the report, tests of design along with durability, repeatability, and sensitivity were conducted. One hundred bridgewire resistances were measured with the 4-contact and 2-contact connector designs. The 4-contact connector showed a resistance which averaged 0.0055 ohms lower than the 2-contact connector. To determine the effect extended wear had upon the connector, an initiator was mated 1000 times with the test connectors. The value of bridgewire measurements taken with the units on three initiators before and after the engagements did not vary. One final test of the connector was to compare contact resistance sensitivity. The gold plating was sandblasted from the pins. Bridgewire measurements were taken with both connectors before and after sandblasting and the measurements did not vary for the four contact design, but increased 0.025 ohms for the 2-contact design.

TEST REPORT

"Currently, the IRME (Initiator Resistance Measurement Equipment) uses a two-wire (two points of pin contact) connector to mate with the NSI (NASA Standard Initiator). This connector is wired such that pinto-connector contact resistance is included with bridgewire resistance measurement. The sensitivity to contact resistance can alter data and requires the disposal of connectors after 500 cycles of mate/demate with NSI's. To eliminate this problem, a four-wire (four points of pin contact) connector was designed and tested. Theoretically, the four-wire connector is completely insensitive to contact resistance.

Tests of mechanical durability, measurement repeatability, and contact resistance sensitivity were conducted on two four-wire connectors. Mechanical durability compared measurements of 3 inert NSI's before and after 1000 mate/demates of each connector with an inert NSI. Measurement repeatability was tested by measuring 100 live NSI's with each test connector. This data was then compared to measurements of the same NSI's with a new two-wire connector. Finally, contact resistance sensitivity was indicated by comparing measurements before and after sandblasting of the pins of the inert NSI.

The durability evaluation yielded positive results. The average difference of measurements before and after 1000 mate/demates was zero for each of the 2 test connectors.

The average difference of measurements made by the 2 test connectors on 100 live NSI's was approximately 0.001 ohm. Probable causes of this small difference include IRME calibration limits and normal drift. The average difference of the two-wire and test connector measurements was 0.0055 ohm.

The four-wire connectors acted insensitive to the contact resistance induced by sandblasting of NSI pins. Average measurement differences for the test connectors (before and after sandblasting) were 0.000 and −0.001 ohm. In comparison, the two-wire connector difference was 0.025 ohm.

The results of the Four-Wire Connector Tests indicate that the four-wire connector will yield more accurate results by eliminating contact resistance and will also last longer in the field than the current two-pin connectors."

The features of the 4-contact connector as indicated in the foregoing test report make it unique for uses which require repeated resistance measurements on two pin initiator devices. Specific applications thus include manufacturing and test facilities where large numbers of measurements are required. Incorporation of the 4-contact connector into instrumentation also reduces the effect of contact resistance on measurements and increases service life of the connector.

The 4-contact connector of the present invention reduces the effects of contact resistance on bridgewire measurements where variations in the resistance value on a given initiator are not permitted to vary more than 0.05 ohms from measurement to measurement. Reduction of contact resistance sensitivity has therefore resulted in the elimination of the 500 cycle limit on the connector. Some units have demonstrated a connector life of greater than 7000 cycles.

OPERATION

Operation of the connector in a four-terminal resistance system can be seen in FIG. 10 for example. The connector 40 consists of four electrically independent female sockets. Sockets A and B provide contact with the male pins of the initiator device to supply the resistance measuring current. Sockets C and D provide contact to pickup the resistance measuring voltage. As can be seen in FIG. 8, the voltage and current circuits 19 and 20 are separate and independent from each other. Voltage drop created by the measuring current flowing through contact resistance at points A and B has no effect on the measuring voltage because it is measured independently at points C and D. The varying contact resistances at points A and B have no effect on the resistance measuring current because the constant current power supply 25 of the IRME is able to compensate by automatically adjusting the voltage to keep the current constant. Voltage drop at points C and D is insignificant because connector contact resistances vary in tenths of ohms, while the voltage measuring device 24 of the IRME typically has a resistance of several million ohms. This results in a very small current flowing in the voltage measuring circuit 19. This small current and small connector contact resistance produces insignificant voltage when compared to the voltage drop caused by the current across the voltage measuring device input resistance.

The total effect is to control the contribution that contact resistance at points A, B, C, and D, has upon the measurement made on the unknown resistance.

There can be various configurations of the connector device as required to mate with the different types of pins that may exist on the devices to be measured. Thus, the configuration of the pins could be changed or rearranged as required to improve ease of manufacturing or production costs. The shell 12 may have a key member 41 to mate with a key way of the initiator 11. However, the main feature of this invention is to provide separate circuits in the test connector for the test current and voltage whatever the configuration of the pins.

This invention has the advantage of eliminating the effects test connectors have on resistance measurements. As a consequence, precise and accurate measurements of resistances are possible for critical components. Unnecessary rejection of acceptable hardware is also avoided. Additionally, extremely small variations in resistance within a device over time can be monitored and appropriate actions taken. This aspect is especially significant as it relates to the evaluation and analysis of long term aging effects for critical components.

The improved feature in the instant connector is that separate electrical contacts are provided for the current and voltage circuits of four-terminal resistance measuring devices.

While a single embodiment of the invention has been described, variations thereof can be made without departing from the teaching of the invention. Therefore it is intended that the scope of the invention be limited only by the claims which follow.

We claim:

1. In a system for testing and precisely measuring the resitance of the bridgewire of a pyrotechnic initiator used for starting pyrotechnic events aboard a Space Transportation System, the initiator having a pair of male contact pins attached to the bridgewire and an annular case surrounding said pins, said case having a keyway in its inner wall, the testing system including separate and independent voltage sensing and current supply circuits with the current supply circuit including a constant current-type power source whereby the magnitude of current remains substantially constant with changes in resistance in the current supply circuit and the voltage measuring device has a very high input resistance so that changes in resistance of the voltage measuring circuit cause only insignificant changes in the voltage measurement, the improvement which comprises: a four-terminal electrical connector formed of a connector shell having a longitudinal key member to engage with the keyway in the annular case of the initiator and having a pair of electrically independent and separate forward socket contacts and a pair of electrically independent and separate rear socket contacts, the forward pair of socket contacts being constructed and arranged to receive and mate with the pins of the initiator to be tested, the voltage sensing circuit including the forward pair of socket contacts, and the current supply circuit including the rear pair of said socket contacts, the rear pair of said socket contacts providing the resistance measuring current and the forward pair of said socket contacts measuring the resistance voltage of the bridgewire thereby minimizing contact resistance degradation effects.

2. The device of claim 1 wherein the connector shell includes at least two elongated bores therein and the contacts are located along the bores.

3. The device of claim 2 wherein the bores are substantially parallel with the axis of the shell and extend from one end of the shell to the other end thereof.

4. In a system for testing and precisely measuring the resistance of the bridgewire of the pyrotechnic initiator, the initiator having a pair of male contact pins attached to the bridgewire, the testing system including separate and independent voltage sensing and current supply circuits with the current supply circuit including a constant current-type power source whereby the magnitude of current remains substantially constant with changes of resistance in the current supply circuit and the voltage measuring device has a very high input resistance so that changes in resistance of the voltage measuring circuit cause only insignificant changes in the voltage measurements, the improvement which comprises: a four-terminal electrical connector formed of a connector shell having a pair of electrically independent and separate forward socket contacts and a pair of electrically independent and separate rear socket contacts, the forward pair of socket contacts being constructed and arranged to receive and mate with the pins of the initiator to be tested, the voltage sensing circuit including the forward pair of socket contacts, and the current supply circuit including the rear pair of said socket contacts, the rear pair of said socket contacts providing the resistance measuring current and the forward pair of said socket contacts measuring the resistance voltage of the bridgewire thereby minimizing contact resistance degradation effects.

5. The device of claim 4 wherein the connector shell includes at least two elongated bores therein and the contacts are located along the bores.

6. The device of claim 5 wherein the bores are substantially parallel with the axis of the shell and extend from one end of the shell to the other end thereof.

* * * * *